US008637396B2

(12) United States Patent  (10) Patent No.: US 8,637,396 B2
Matz et al.  (45) Date of Patent: Jan. 28, 2014

(54) DIELECTRIC BARRIER DEPOSITION USING OXYGEN CONTAINING PRECURSOR

(75) Inventors: Laura M. Matz, Allentown, PA (US); Raymond Nicholas Vrtis, Orefield, PA (US); Mark Leonard O'Neill, San Marcos, CA (US); Dino Sinatore, Whitehall, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 1101 days.

(21) Appl. No.: 12/623,998

(22) Filed: Nov. 23, 2009

(65) Prior Publication Data

US 2010/0136789 A1  Jun. 3, 2010

Related U.S. Application Data

(60) Provisional application No. 61/118,769, filed on Dec. 1, 2008.

(51) Int. Cl.
*H01L 21/4763* (2006.01)

(52) U.S. Cl.
USPC ........... 438/623; 438/627; 438/643; 438/653; 438/780; 438/793; 257/E21.24; 257/E21.295; 257/E21.266

(58) Field of Classification Search
None
See application file for complete search history.

(56) References Cited

U.S. PATENT DOCUMENTS

| | | | |
|---|---|---|---|
| 4,298,753 A * | 11/1981 | Schinabeck et al. | .......... 556/415 |
| 6,068,884 A | 5/2000 | Rose et al. | |
| 6,258,735 B1 | 7/2001 | Xia et al. | |
| 6,383,955 B1 | 5/2002 | Matsuki et al. | |
| 6,410,463 B1 | 6/2002 | Matsuki | |
| 6,432,846 B1 | 8/2002 | Matsuki | |
| 6,875,687 B1 | 4/2005 | Weidman et al. | |
| 7,064,088 B2 | 6/2006 | Hyodo et al. | |
| 7,229,934 B2 | 6/2007 | Dubois et al. | |
| 7,314,828 B2 * | 1/2008 | Lin et al. | ........................ 438/637 |
| 7,622,400 B1 * | 11/2009 | Fox et al. | ........................ 438/784 |
| 2001/0009295 A1 | 7/2001 | Furusawa et al. | |
| 2001/0021590 A1 | 9/2001 | Matsuki | |
| 2002/0142579 A1 | 10/2002 | Vincent et al. | |
| 2004/0175501 A1 | 9/2004 | Lukas et al. | |
| 2004/0197474 A1 * | 10/2004 | Vrtis et al. | ............... 427/255.28 |
| 2005/0034667 A1 | 2/2005 | Tsuji et al. | |
| 2005/0042884 A1 | 2/2005 | Hyudu et al. | |

(Continued)

FOREIGN PATENT DOCUMENTS

| | | |
|---|---|---|
| EP | 1 225 194 A | 7/2002 |
| EP | 1 225 194 A2 | 7/2002 |

(Continued)

*Primary Examiner* — Zandra Smith
*Assistant Examiner* — Khanh Duong
(74) *Attorney, Agent, or Firm* — Rosaleen P. Morris-Oskanian (57) ABSTRACT

A method is provided for depositing a dielectric barrier film including a precursor with silicon, carbon, oxygen, and hydrogen with improved barrier dielectric properties including lower dielectric constant and superior electrical properties. This method will be important for barrier layers used in a damascene or dual damascene integration for interconnect structures or in other dielectric barrier applications. In this example, specific structural properties are noted that improve the barrier performance.

32 Claims, 9 Drawing Sheets

(56) References Cited

U.S. PATENT DOCUMENTS

| | | |
|---|---|---|
| 2005/0221622 A1 | 10/2005 | Shioya et al. |
| 2006/0115980 A1 | 6/2006 | Ko et al. |
| 2006/0258176 A1 | 11/2006 | Fukazawa et al. |
| 2006/0269690 A1 | 11/2006 | Watanabe et al. |
| 2008/0099918 A1 | 5/2008 | Streck et al. |
| 2008/0150138 A1 | 6/2008 | Bright et al. |
| 2008/0173985 A1 | 7/2008 | Belyansky et al. |
| 2008/0197513 A1 | 8/2008 | Restaino et al. |

FOREIGN PATENT DOCUMENTS

| | | |
|---|---|---|
| JP | 2000-174019 | 6/2000 |
| JP | 2001-203200 | 7/2001 |
| JP | 2002-134502 | 5/2002 |
| JP | 2002-256434 | 9/2002 |
| JP | 2005-064516 | 3/2005 |
| JP | 2005-072584 | 3/2005 |
| JP | 2006-332676 | 12/2006 |
| JP | 2008-263097 | 10/2008 |

\* cited by examiner

DIELECTRIC BARRIER DEPOSITION USING OXYGEN CONTAINING PRECURSOR

CROSS REFERENCE TO RELATED APPLICATION

The present application claims the benefit of U.S. Provisional Patent Application Ser. No. 61/118,769 filed Dec. 1, 2008.

BACKGROUND OF THE INVENTION

In the microelectronics industry, pattern density shrinks have enabled significant performance gains and continue to occur in the predictable 2 year cycle according to Moore's Law. In order to maintain or improve the operations of a device, both transistor and interconnect level changes have been made. More specifically focusing on the interconnect structures (commonly referred to as the back-end-of line, BEOL), the dimensional shrink has caused a transition from aluminum to copper metallization in order to maintain tolerable line resistances. In order to maintain adequate capacitance between copper lines, the dielectric or insulating films that enclose the copper lines have also changed to compensate for the integration changes necessary for the patterning changes. In order to minimize capacitance of the insulating films, the dielectric constant (k) of each dielectric should ideally be continually reduced. For the interlevel dielectrics ("ILD"), this transition has continually occurred from silicon dioxide to fluorosilicate glass to dense organosilicate glass and finally to porous organosilicate glass with k values of 4.0, 3.3-3.7, 2.7-3.1, and <2.6, respectively.

Typically, the ILD insulating films can retain moisture in the dielectrics. Given that copper is susceptible to rapid oxidation that can cause reliability issues, barrier dielectrics comprise a portion of the dielectric stack to serve as a diffusion barrier between the copper lines and ILD films, preventing diffusion of water from the ILD onto the copper surface and preventing copper diffusion into the ILD films. Contrary to the trends for ILD films, the barrier dielectrics have not scaled significantly, due to the reliability functions that the dielectrics serve within the interconnect structure. However, given the disproportionate scaling in dielectric constant of the ILD films relative to the barrier dielectrics, the capacitance contribution of the barriers now is more significant to the overall capacitance of the interconnect structure than in previous technology nodes.

Other semiconductor applications, such as photovoltaics and thin-film display devices, also have requirements for lower k value dielectric barrier films. In these applications, the need for copper diffusion properties is not needed but there are other additional requirements such as transparency, wet chemical resistance and high mechanical strength. In addition, the ability to tune the dielectric properties for density, refractive index, film composition and electrical properties is a necessity.

In this invention, plasma enhanced chemical vapor deposition (PECVD) processes with incorporation of siloxane precursors provide dielectric films with dielectric constants that are significantly lower than current barrier dielectric films while still maintaining adequate barrier properties. The current industry standard precursors, 3MS (trimethylsilane) or 4MS (tetramethylsilane), provide good properties but are difficult to reduce their dielectric constants.

The prior art calls out specific process conditions for alkylalkoxysilanes that provide lower dielectric constants. Under these situations, residence times of the reaction gases in the chamber are >100 ms in order to provide sufficient reactivity for the gases in order to get linear siloxane films. The prior art also suggests that it is desired to have lower dielectric constants below 3.1 and that this is achieved by increasing the residence time of the precursor in the chamber.

Prior art relevant to the field of this invention includes: US2006/0251876A1, U.S. Pat. No. 6,383,955, and US2001/0021590.

BRIEF SUMMARY OF THE INVENTION

The present invention is a process for forming a barrier dielectric film between a dielectric film and a copper feature of an integrated circuit, comprising the steps of;

providing an integrated circuit substrate having a dielectric film prior to the formation of a copper feature;

contacting the substrate with a barrier dielectric film precursor of the formula:

$R_xR'_y(OR'')_z(OR''')_aSi$ wherein R, R" and R''' are each individually selected from the group consisting of methyl, ethyl and vinyl; R' is selected from the group consisting of hydrogen, methyl, ethyl and vinyl; and x, z and a are each individually 1-3 and y is 0-2, wherein x+y+z+a=4;

forming a barrier dielectric film on a substrate using plasma enhanced chemical vapor deposition.

In one embodiment, the present invention is a process for forming a barrier dielectric film between a dielectric film and a copper feature of an integrated circuit, comprising the steps of;

providing an integrated circuit substrate having a dielectric film prior to the formation of a copper feature;

contacting the substrate with a barrier dielectric film precursor selected from the group consisting of diethoxymethylsilane, dimethylidethoxysilane and mixtures thereof, and a chemical selected from the group consisting of hydrogen, helium, ammonia and mixtures thereof;

forming a barrier dielectric film on the substrate using plasma enhanced chemical vapor deposition at a temperature in the range of 100° C. to 400° C.;

forming a copper feature on the barrier dielectric film.

In another example, a barrier dielectric is formed on a substrate requiring diffusion barrier properties for applications such as photovoltaics or flat panel displays.

In one embodiment of this invention, it is preferred that the insulating film properties are controlled by incorporating varied levels of hydrogen gas into the reaction plasma with the linear alkylalkoxysilane precursor in order to control the dielectric constant and subsequent density of the film. Similar properties can also be achieved by maintaining the hydrogen to precursor gas ratio but modifying the pressure or RF power within the chamber in order to control the level of $C_xH_y$ conversion to Si—C bonding in the film that is desired. Under the specific deposition conditions, the plasma energy and hydrogen levels directly correlate to the dielectric constant and density of the film.

In another embodiment, the substrate temperature is modified to lower temperatures in order to deposit on substrates with lower thermal budgets. In this example, the deposition conditions impart less thermal energy into the precursor and require a higher hydrogen to precursor ratio in order to achieve the desired insulating properties including k values of 3.5 or greater with densities of >1.5 g/cc.

In another embodiment, it is desired to deposit a silicon oxycarbide containing insulating dielectric film at higher temperatures up to 400 C in order to be commensurate with other desired aspects of the integration process. At elevated temperatures, reduced hydrogen to precursor ratio is desired in order to maintain k values that are preferably below 4.0.

DETAILED DESCRIPTION OF THE INVENTION

The method described is for deposition of a film utilizing an alkylalkoxysilane precursor comprised of silicon, carbon, oxygen and hydrogen to improve barrier properties. Plasma-enhanced chemical vapor deposition (PECVD) is utilized to react the siloxane species with various dopant gases including He, argon, carbon dioxide, nitrogen, ammonia, hydrogen, or oxygen.

Although a single process step is preferred, in many instances it is also within the scope of the invention to post-treat the film after deposition. Such post-treating can include, e.g., at least one of thermal treatment, plasma treatment, ultra violet (UV)/visible (Vis)/infrared (IR) radiation, and chemical treatment to improve one or more of the film properties. For example, the post-treatment may provide lower dielectric constants, while maintaining the desired density and/or stress. Alternatively, the addition of UV curing may provide either hardening or densification to the film with minimal impact to the dielectric constants, not exceeding 4.5.

Energy is applied to the gaseous reagents to induce the gases to react and to form the film on the substrate. Such energy can be provided by, e.g., plasma, pulsed plasma, helicon plasma, high density plasma, inductively coupled plasma, and remote plasma methods; all of these referred to herein as plasma enhanced. A secondary rf frequency source can be used to modify the plasma characteristics at the substrate surface.

The flow rate for each of the gaseous reagents preferably ranges from 10 to 5000 sccm, more preferably from 200 to 2000 sccm, per single 200 mm wafer. Total flow rates are desired to be above 400 sccm for adequate precursor reaction. Liquid chemical flows are in the range of 0.1 to 10 g/minute, preferably 0.5 to 3 g/minute. The individual rates are selected so as to provide the desired amounts and ratios of silicon, carbon, oxygen, hydrogen, etc. in the film. The actual flow rates needed may depend upon wafer size and chamber configuration, and are in no way limited to 200 mm wafers or single wafer chambers.

The pressure in the vacuum chamber during deposition is preferably 0.01 to 760 torr, more preferably 1 to 20 torr.

The film is preferably deposited to a thickness of 0.002 to 10 microns, although the thickness can be varied as required. The blanket film deposited on a non-patterned surface has excellent uniformity, with a variation in thickness of less than 2% over 1 standard deviation across the substrate with a reasonable edge exclusion, wherein e.g., a 10 mm outermost edge of the substrate is not included in the statistical calculation of uniformity.

The density of the film can be increased with the correspondingly typical increased dielectric constant of the material and extending the applicability of this material to future generations. It will be common knowledge to those familiar with the art to be able to modify film properties with deposition conditions, as described in more detail in the proceeding discussion.

Films of the invention preferably have a density of 1.5 g/cc or greater, or more preferably, 1.8 g/cc or greater.

Films of the invention have improved properties relative to known films produced from other candidate precursors such as trimethylsilane. In certain embodiments, the film has a dielectric constant less than 6.0, preferably in the range from 6.0 to 3.2, more preferably 6.0 to 3.5, still more preferably from 4.2 to 3.2, most preferably 4.2 to 3.5.

Films of the invention are thermally stable, with good chemical resistance.

The films are suitable for a variety of uses. The films are particularly suitable for use as a barrier film to prevent species diffusion into other integrated layers. In one embodiment, the deposition is performed on a semiconductor substrate, and is particularly suitable for use as, e.g., an insulation layer, a capping layer, a chemical-mechanical planarization (CMP) or etch stop layer, a barrier layer (e.g., against diffusion of metals, water or other materials that can be undesirable in insulating layers) and/or an adhesion layer in an integrated circuit. The films can form a conformal coating. The mechanical properties exhibited by these films make them particularly suitable for use in Al subtractive technology and Cu damascene technology.

The films are compatible with chemical mechanical planarization and anisotropic etching, and are capable of adhering to a variety of materials, such as silicon, $SiO_2$, $Si_3N_4$, organosilicate glass (OSG), fluorine silicon glass (FSG), silicon carbide, antireflective coatings, photoresists, organic polymers, porous organic and inorganic materials, metals such as copper and aluminum, and metal barrier layers, and copper adhesion treatment processes.

Although the invention is particularly suitable for providing films and products of the invention are largely described herein as films, the invention is not limited thereto. Products of the invention can be provided in any form capable of being deposited by CVD, such as coatings, multilaminar assemblies, and other types of objects that are not necessarily planar or thin, and a multitude of objects not necessarily used in integrated circuits.

The siloxane precursor provides improved barrier properties, including; good etch selectivity, excellent electrical characteristics, such as; reduced leakage and higher electrical breakdown, reduced dielectric constant and the flexibility to significantly tune these properties for the desired range that is needed.

In this invention, particular preferred characteristics of the precursor structure are noted for providing the preferred superior barrier properties. An alkylalkoxysilane with the generic structure, $R_xR'_y(OR'')_z(OR''')_a$—Si is found to have preferred properties when the R, R', R'' or R''' group is either $C_2H_5$ or $CH_3$, and R' can be hydrogen, wherein each of x, y, z and a are 1-3 and x+y+z+a=4, but when R' is hydrogen, y=0-2. It was found in a specific example, the incorporation of 2 alkyl groups increases the refractive index of the dielectric film, while 2 alkoxy groups improve the density/k value relationship that is desired.

In the present invention, we have found that generally alkylalkoxysilanes as a replacement to either 3MS or 4MS for barrier dielectric films can improve the barrier properties of the dielectric film, while reducing the dielectric constant. In one embodiment, the specific precursor structure of dimethyldimethoxysilane (DMDMOS) provides optimal barrier properties, when balancing the desired film properties required for a barrier film: density and dielectric constant.

In this invention, plasma enhanced chemical vapor deposition incorporating an alkylalkoxysilane precursor to form an oxygen-containing silicon carbide film is disclosed. Traditionally, the standard barrier dielectric deposition processes have incorporated alkylsilanes (ie. trimethylsilane and tetramethylsilane) with either oxidants (carbon dioxides, oxygen, or nitrous oxide) or nitrogen containing reactant gases (nitrogen and ammonia) to form oxygen or nitrogen silicon carbide films, however, there is a limitation to how low the dielectric constants for this deposition can be scaled, while still maintaining density.

To serve as an etch stop film, reasonable film selectivity between the ULK (ultra low k) film and the barrier dielectric film needs to be achieved. A higher refractive index barrier film typically provides better selectivity, specifically >1.5. During our testing, it was found that in order to get higher refractive index films, in the generic precursor structure, $(R_x)(R'_y)Si(OR''_z)(OR'''_a)$, R and R', must be linear alkyl groups with the general formula: $C_bH_c$, where b=1-2 and c=3 or 5.

The barrier dielectric film precursor is preferably selected from the group consisting of diethoxymethylsilane; dimethylethoxysilane; dimethyldiethoxysilane; diethyldiethoxysilane; dimethyldimethoxysilane; methyldiethoxysilane; methylethoxysilane; methylmethoxysilane; ethylethoxysilane; ethylmethoxysilane; methyltriethoxysilane; ethyltriethoxysilane; methyltrimethoxysilane; methyltrimethoxysilane; ethyltrimethoxysilane and mixtures thereof. More preferably the barrier dielectric film precursor is dimethyldiethoxysilane.

Figure 1:
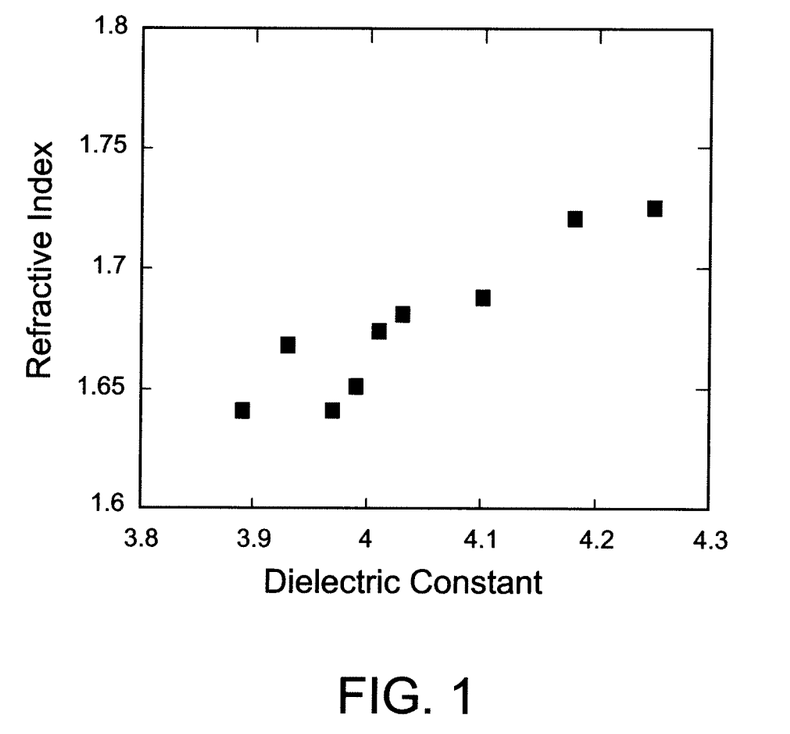
FIG. 1 is a graph showing the correlation between film refractive index and dielectric constant for a series of barrier films; employing dimethyldiethoxysilane (DMDES) as the precursor.

In one example, it was found that testing with diethoxymethylsilane where R=$CH_3$ and R'=H, the refractive index was found to be significantly low for all process conditions tested (<1.5). By modifying the R' group to be $CH_3$, i.e., dimethyldiethoxysilane, the average refractive index increased and could be modified over a range of 1.5-2.2 with modulation of the deposition conditions, either through chamber process conditions or through modification of the dopant gas. In one specific example, the addition of hydrogen as a reactant gas increases the refractive index to approach values greater than 1.8. An example of this is shown in FIG. 1, where the refractive index correlation to k value is demonstrated for insulating films deposited with dimethyldiethoxysilane and varying amounts of hydrogen. As shown in the graph, the refractive index values for this film are maintained above 1.5 and preferably above 1.6 for enhanced etch selectivity.

The second critical property of a barrier film is the barrier diffusion properties, specifically to prevent moisture diffusion, which can contribute to reliability failures in an electrical device. Film density is typically used as a strong indicator of diffusion properties. Current state of the art barrier films in the industry typically have densities of 1.8-2.0 g/cc, utilizing trimethylsilane or tetramethylsilane as the precursor. However, the issue with precursors in the prior art is that in order to get the desired densities needed for adequate barrier properties, it is difficult to scale the dielectric constant.

Figure 2:
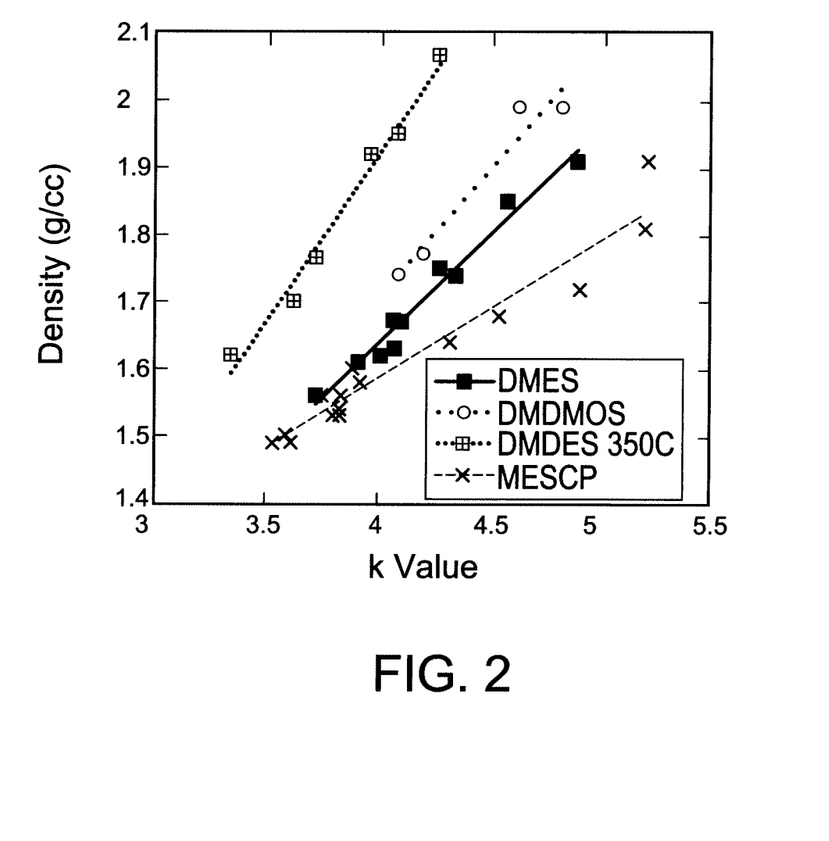
FIG. 2 is a graph of density (g/cc) versus k value for DMES (dimethylethoxysilane), DMDMOS (Dimethyldimethoxysilane), DMDES (dimethyldiethoxysilane), and MESCP (methylethoxysilacyclopentane). Films were all deposited at 350 C in this study with similar deposition conditions to provide direct comparison of precursor influence.

The initial testing with several alkylalkoxysilane precursors shown here demonstrates that using an oxygen-containing silicon precursor, the k can be reduced while still maintaining fairly high density films. In FIG. 2, the correlation between density and k value for three linear alkylalkoxysilane precursors: dimethylethoxysilane (DMES); dimethyldimethoxysilane (DMDMOS); dimethyldiethoxysilane (DMDES); as well as methyethoxysilacyclopentane (MESCP); is shown. With higher ratios (slopes) for the density/k relationship, the result will be a more dense film for the same nominal dielectric constant. Given that a minimum density of 1.5 g/cc is desired, it can be seen that the precursors of the present invention: DMES, DMDMOS and DMDES have dielectric values approximating 3.2 at that minimum density, as the slope of the graphs for each of those precursors converge at 1.5 g/cc and k=3.2. Comparison of the 4 precursors identifies that the MESCP compound has fairly low density to k trends. This undesirable result for MESCP is attributed to the non-linear hydrocarbon groups bonded to the silicon atom.

More specifically, the goal of the present invention is to have a precursor that provides a high density/k ratio, so that the density can be maintained, while reducing the dielectric constant or increasing the density, while maintaining the k value. As shown in Table 1, below, the linear curve fit parameters for this density to k value relationship is represented for 3 of the linear alkylalkoxysilanes of FIG. 2; as well as methyethoxysilacyclopentane (MESCP). As demonstrated, it is desired to have a ratio or slope for this relationship above 0.3 and also a lower y-intercept approaching zero, but more specifically <0.3. Generally, the linear alkyl groups are found to provide improved density for the same k values. Within this family, there is additional benefit to having a preferred structure of ethyl functionality for R'' and R''' and methyl functionality for R and R'. This point will be elaborated in following sections, but it is important to note the best density/k results are obtained with dimethyldimethoxysilane (DMDES), which incorporates both of these functionalities.

In some integration schemes, there will be exposed copper prior to dielectric deposition. In these examples, an oxygen-containing film can not be deposited directly to the copper, due to the preference for copper oxidation and reduced adhesion. In these specific integration schemes, prior to the siliconoxycarbide deposition, an interface layer is needed for adequate adhesion. In one embodiment, this interface layer could be electroless plated CoWP or other copper treatment processes, that would protect it from oxidation. In another example, the interface layer could be a thin higher k value nitrogen silicon carbide or silicon nitride, where the thicknesses can range from 20 to 600 Å. In another embodiment, the interface layer could be an alternative surface layer that is used to form a good interface, which also exhibits oxygen diffusion properties.

TABLE 1

Comparison of density to k value curve fit relationships for 4 alkoxy silane precursors with variation in the structural groups bonded to the silicon

|  | y-int | slope | R | x | R' | R" | R''' |
|---|---|---|---|---|---|---|---|
| DMES | 0.333 | 0.326 | Methyl | 2 | Hydrogen | Ethyl |  |
| DMDMOS | 0.151 | 0.389 | Methyl | 1 | Methyl | Methyl | Methyl |
| DMDES | −0.085 | 0.502 | Methyl | 1 | Methyl | Ethyl | Ethyl |
| MESCP | 0.752 | 0.208 |  |  |  |  |  |

In one embodiment, use of hydrogen and helium as diluent gases is a preferred deposition condition. As it has been previously established in FIG. 2 that there is a linear relationship between increasing density and k values, k values in the range of 3.5 to 4.2 are desired in order to balance the need for reasonable density with low k values (i.e <4.2). In one embodiment, helium is utilized as the carrier gas for the liquid precursor, and hydrogen is utilized as a reactant gas to control the level of alkyl groups incorporated in the film.

Figure 3:
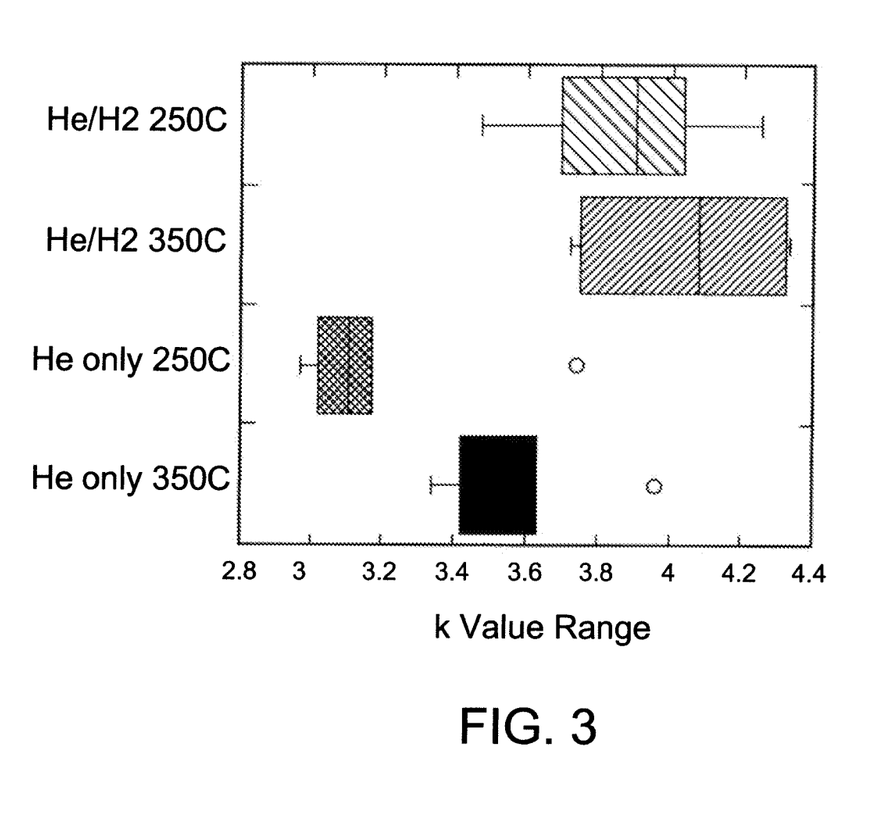
FIG. 3 is a graph of the k value ranges achieved for DMDES (dimethyldiethoxysilane) depositions performed at 250 C and 350 C using: (i) helium as the liquid carrier gas+ hydrogen as the reactant gas; and, (ii) helium only as the liquid carrier gas.

In FIG. 3, the average k value ranges for barrier film depositions, using DMDES as the precursor, are shown with helium only, as well as with hydrogen added to the helium carrier gas. In this example, it was found that in order to get the k values within the desired range, flow rates from 100 to 800 sccm of hydrogen provided improved ease of achieving these properties. The improvements in properties with hydrogen are suspected to originate from H radical species that are generated in the plasma. The hydrogen radicals could react with the hydrogen from the $CH_3$ species on the DMDES structure and enable a higher percentage to convert to Si—C bonding; thus enabling higher density and somewhat higher k value films. This conversion to Si—C will also occur in the helium plasma conditions, however, the efficiency is thought to be lower. Based on the data in FIG. 2, the density/k relationship is not significantly altered by dopant conditions; however there are specific conditions that will enable the desired k value range. It is also shown in FIG. 3 that this effect of k value range can be achieved with lower deposition temperatures, such as: 250 C and 350 C.

Figure 4:
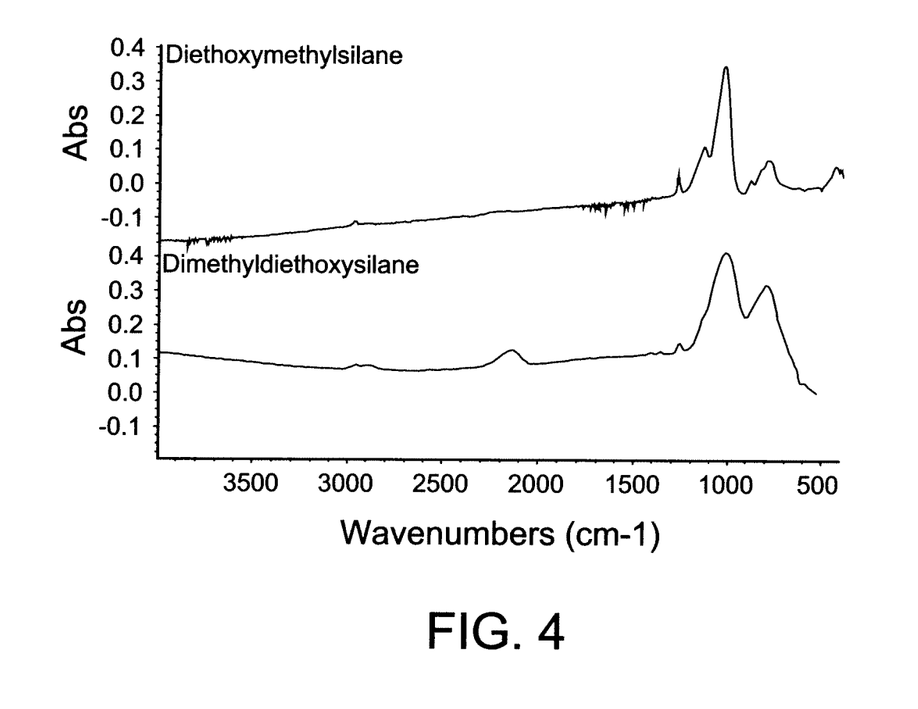
FIG. 4 is an FTIR Spectral Comparison of DEMS (diethoxymethylsilane) and DMDES (dimethyldiethoxysilane).

In order to achieve good etch selectivity and barrier properties, it is generally thought that some silicon carbide bonding by conversion of the linear alkyl groups is needed. In FIG. 4, FTIR analysis of two films deposited with two linear alkylalkoxysilane precursors, diethoxymethylsilane and dimethyldiethoxysilane, are shown. On a qualitative scale, the ratio of Si—O (~1100 $cm^{-1}$) to Si—C (860 $cm^{-1}$) bonding is desired to approach 2:1 peak area ratio. The diethoxymethylsilane film bonding has a much higher Si—O bonding than Si—C, due to the single methyl group incorporated into the precursor structure, as shown by the respective peak areas at 1270 $cm^{-1}$. In contrast, the dimethyldiethoxysilane film shows greater Si—C bonding and lower levels of SiO:SiC, as shown by the elevated peak areas for the DMDES spectrum at 860 $cm^{-1}$ corresponding to greater SiC bonding in the film. Also, it should be noted that the Si—$CH_3$ peak area at 1273 $cm^{-1}$ is reduced in the DMDES spectrum due to conversion from Si—$CH_3$ to Si—C bonding.

Figure 5:
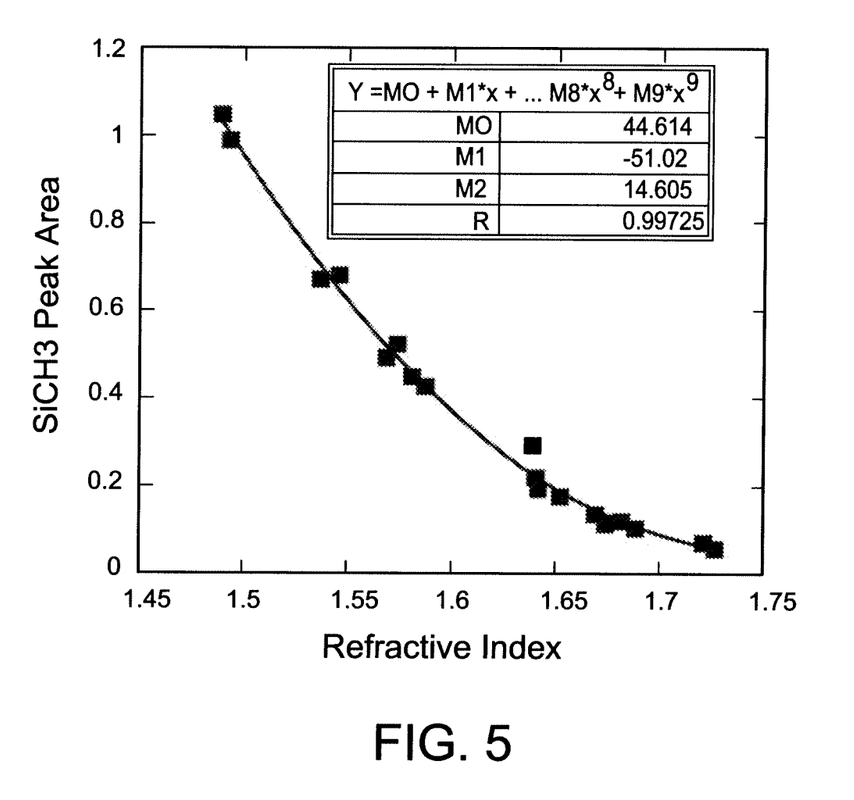
FIG. 5 is a graph showing the Si—$CH_3$ FTIR integrated peak area correlation to refractive index. Films in this graph were deposited with DMDES and hydrogen using helium as the liquid carrier gas and are the result of films measured over a wide range of deposition conditions and temperatures ranging from 150 C to 350 C, including 180 C, 200 C, 250 C and 300 C.

More specifically, the structure of the precursor and ability to control the number of terminal groups has been found to directly correlate to k value. In FIG. 5, there is a direct correlation between the refractive index (and corresponding k value) for the film and the Si—$CH_3$ integrated peak area. As the refractive index of the film increases, the Si—$CH_3$ peak area decreases, due to the increased Si—C bonding in the film. Therefore, a key to controlling film properties, specifically for the preferred embodiment of DMDES with hydrogen, is through controlling the reaction with the methyl alkyl groups for the desired level of Si—C bonding.

In this invention, the general deposition of alkylalkoxysilane precursors with PECVD deposition conditions will be described. Typical deposition temperatures can range from 100° C. to 500° C. with a preferred deposition range of 150° C. to 400° C. The examples will have either been deposited at 150° C., 180 C, 200 C, 250 C or 350° C. In addition, the preferred operating PECVD deposition conditions are listed in Table 2.

TABLE 2

Summary of PECVD deposition conditions

|  | Maximum | Minimum | Preferred |
|---|---|---|---|
| Power (W) | 200 | 1000 | 600 |
| Spacing (mils) | 500 | 100 | 400 |
| Pressure (Torr) | 9 | 2.5 | 4.5 |
| Temperature ° C. | 500 | 200 | 350 |
| He (sccm) | 2000 | 100 | 300 |
| NH3 (sccm) | 2000 | 100 | 300 |
| H2 (sccm) | 2000 | 100 | 300 |
| CO2 (sccm) | 2000 | 100 | 300 |

Another potential issue that has been presented with the current 3MS or 4MS barrier dielectric films is the change in film properties with exposure to ultraviolet ("UV") radiation or electron beam, specifically properties, such as; an increase in dielectric constant or change in film stress. In some integration schemes, the use of UV may be incorporated, and changes in the film properties can cause potential issues with reliability or other electrical metrics, such as integrated capacitance. In the example below, use of alkylalkoxysilanes, with specific deposition gases (i.e, ammonia and hydrogen), reduces the film's susceptibility to k shift with UV exposure and also stress changes.

In the prior art, it is specified that alkylalkoxysilanes are supplied in a PECVD reactor for extended residence times (>100 ms) in order to improve the reaction and subsequent density of the film. In the testing and examples presented here, the residence times based on the precursors are less than 85 msec, preferably on the order of 10-70 msec, more preferably 20-65 msec, based on the pre-defined equation of:
(1)

$$Rt[s] = 9.42 \times 10^7 (PrTs/PsTr) r_w^2 d / F$$

Where the Following Definitions are:
Pr; reaction chamber pressure (Pa)
Ps; standard atmospheric pressure (Pa)
Tr; average temperature of the reaction gas (K)
Ts: standard temperature (K)
$R_w$-radius of the silicon substrate (m)
D; space between the silicon substrate and the upper electrode (m)
F; total flow volume of the reaction gas (sccm)

Figure 6:
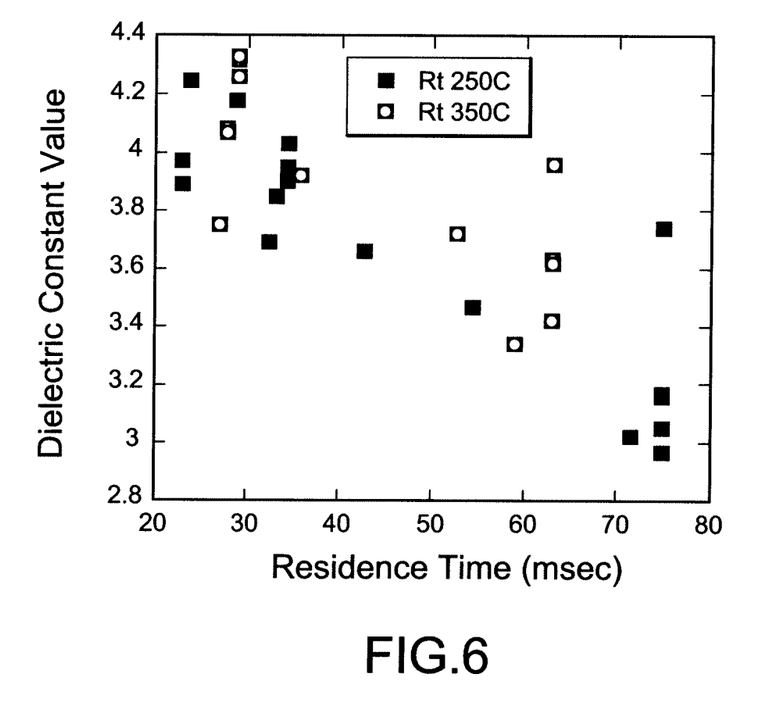
FIG. 6 is a graph of the correlation between gas residence time in the chamber and silicon oxycarbide dielectric constant. Residence time calculations utilized Equation 1, below, where representative examples are provided in Table 3.

Based on this equation and our standard operating conditions, FIG. 6 shows the relationship between precursor residence time and k value achieved. Generally, it has been found that the desired residence times for good reaction of the precursor and control of k values above 3.5 (which correspond to desired densities) are achieved at much lower than 100 msec of the prior art and preferably less than 70 msec, more preferably less than 65 msec. As the residence time is increased, the k value is reduced, which is consistent with the prior art. However, the densities for a good barrier dictate that the range of k values are forced to be >3.2 based on the data summary presented in FIG. 2. Table 3 demonstrates the range of residence times that were calculated based on standard conditions for experimental results reported in this invention. In order to achieve residence times greater than 80 msec, the flows would need to be reduced significantly from our standard operating conditions and have not been found to provide desired film properties as is suggested in the prior art.

TABLE 3

Calculated residence times for standard conditions employing DMDES at 350 C.

| Total Flow (sccm) | Tr (K) | Ts (K) | r² (m) | Pressure (Pa) | Rt (msec) |
|---|---|---|---|---|---|
| 395 | 623 | 273 | 0.01 | 599.95 | 62.87 |
| 421 | 623 | 273 | 0.01 | 599.95 | 58.98 |
| 895 | 623 | 273 | 0.01 | 599.95 | 27.75 |
| 695 | 623 | 273 | 0.01 | 599.95 | 35.73 |
| 472 | 623 | 273 | 0.01 | 599.95 | 52.61 |
| 860 | 623 | 273 | 0.01 | 599.95 | 28.87 |
| 921 | 623 | 273 | 0.01 | 599.95 | 26.96 |
| 895 | 623 | 273 | 0.01 | 599.95 | 27.75 |

EXAMPLES

Example 1

Figure 7:
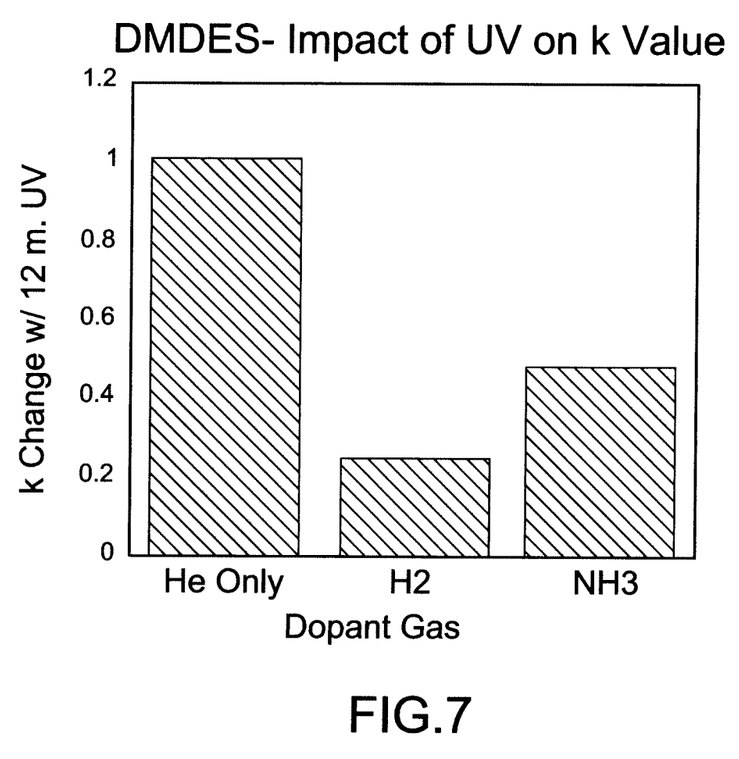
FIG. 7 is a bar graph comparing the k value change of a 12 minute broadband UV exposure to silicon oxycarbide films deposited with different dopant gases.

Dimethyldiethoxysilane was deposited under the preferred conditions of Table 2 and then subjected to 12 minutes broadband UV (eg. Fusion H+ bulb). Three runs of the deposition were conducted: with helium; with hydrogen; and with ammonia. As FIG. 7 shows, dielectric (k) change can be minimized using a dopant gas of hydrogen or ammonia when depositing dimethyldiethoxysilane, when the resulting film is later exposed to UV radiation during subsequent film processing. It is anticipated that the materials produced from this process, and the use of this process condition, will provide film properties more amenable to use in various applications such as IC manufacturing.

Example 2

In some manufacturing schemes, deposition at higher substrate and chamber temperatures are preferred. In this example, dimethyldiethoxysilane was employed as the liquid precursor with a flow rate of 800 mg/min, helium was used as the carrier gas with a flow rate of 200 sccm, and hydrogen was added as a reactant gas with a flow rate of 150 sccm. The deposition chamber was maintained at 40° C. and dielectric films were deposited on a silicon substrate. Given the higher operating temperature, the hydrogen to precursor ratio was set very low, because of the higher thermal energy added to the plasma. As shown in Table 4, the film target of dielectric constant of 4.0 with a density of greater than 1.8 g/cc was able to be achieved by this modulation in the deposition conditions. These films were tested for post-deposition UV stability and found to demonstrate negligible change in dielectric constant with extended UV curing times all the way up to 20 minutes of exposure.

TABLE 4

Measured dielectric film properties for dimethyldiethoxysilane deposition conditions as described in Example 2

| Low-k Barrier Criteria | Data |
|---|---|
| Dep rate | 25 A/s |
| Density(g/cc) | 1.85 |
| Deposition temperature (C.) | 400 |
| Dielectric constant | 4.0 |
| RI | 1.62-1.64 |
| Hardness(Gpa) | 8.14 |

Example 3

Figure 8:
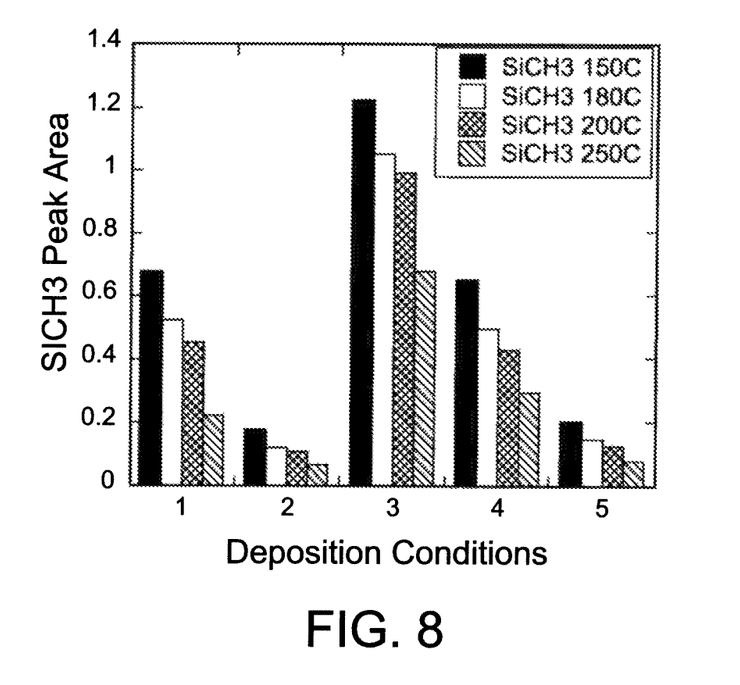
FIG. 8 is a bar graph showing the Si—$CH_3$ FTIR integrated peak area with 5 different deposition pressure and flow ratio conditions and with varied substrate temperatures of 150 C, 180 C, 200 C, and 250 C for each set of 5 conditions. Films in this graph were deposited with DMDES and hydrogen using helium as the liquid carrier gas. The 5 specific deposition conditions are noted in Table 5.
Figure 9:
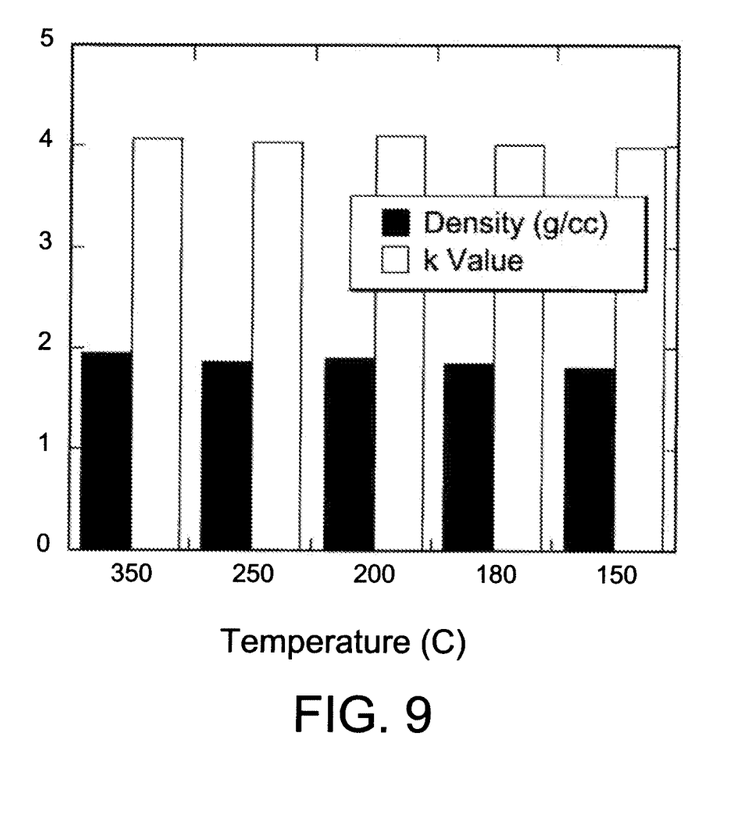
FIG. 9 is a bar graph of density and k value measurements for silicon oxycarbide films deposited with DMDES, helium carrier gas and hydrogen reactant gas at varied chamber deposition temperatures. Modulation of the DMDES:hydrogen gas ratio was employed to achieve the same film properties as the temperature was reduced. The graph demonstrates the ability to achieve similar density and dielectric constants over a range of temperatures from 150 C to 350 C, including 180 C, 200 C, and 250 C.

In some applications such as photovoltaics or low temperature displays, it is desired to have barrier films deposited directly on glass substrate. For deposition on alternative substrates such as glass, there is a need to reduce the thermal budget and subsequent deposition temperature for all films in the process including the barrier films. In FIG. 9, equivalent k and density values were measured for films deposited with dimethyldiethoxysilane as the precursor and hydrogen as the reactant gas. As the substrate temperature was reduced, the hydrogen to precursor ratio was increased in order to compensate for the reduction in thermal plasma energy. By controlling this ratio, equivalent film properties with substrate temperatures from 350 C down to 150 C were achieved. Controlling the chemical reduction of the linear alkyl group from a methyl or ethyl group to silicon carbide bonding in the film directly correlates to the k value and density of the film. In FIG. 8, it is observed that for a given deposition condition, the lowest deposition temperature results in the highest Si—$CH_3$ integrated peak area (black bar, based on FTIR analysis). Comparison of the five deposition conditions shown in Table 5 and compared in FIG. 8, it is observed that the lowest precursor:hydrogen ratios (#2 and #5) provide the lowest Si—$CH_3$ peak areas and, subsequently, are the higher density films. This ratio is adjusted for the temperature of the deposition, where the precursor:hydrogen ratios are reduced as the deposition temperature is lowered in order to achieve the same target k value and densities for a silicon oxycarbide film.

Using this approach to reduce the ratio with lower temperature, k values and density values for 5 deposition temperatures are plotted in FIG. 9, demonstrating the ability for this precursor series to deposit high density films even at relatively low temperatures.

TABLE 5

Deposition conditions comparison for temperature study shown in FIG. 8

| Deposition | Pressure | DMDES:H$_2$ Flow Ratio |
|---|---|---|
| 1 | 3 Torr | 4:5 |
| 2 | 3 Torr | 2:5 |
| 3 | 4.5 Torr | 6:5 |
| 4 | 4.5 Torr | 4:5 |
| 5 | 4.5 Torr | 2:7 |

The invention claimed is:

1. A process for forming a film on a substrate comprising: providing a linear alkylalkoxysilane precursor of the formula:

$$R_xR'_y(OR'')_z(OR''')_aSi$$

wherein R, R" and R'" are each individually selected from the group consisting of methyl, ethyl or vinyl; R' is selected from the group consisting of hydrogen, methyl, ethyl or vinyl; and x, z and a are each individually 1-3 and y is 0-2, wherein x+y+z+a=4;
forming a film on a substrate using chemical vapor deposition reaction of the precursor where a residence time of a flow of the precursor in the reaction is less than or equal to 85 msec, wherein the density of the film is greater than 1.5 g/cc and a dielectric constant is less than 6.0.

2. The process of claim 1 further comprising contacting the substrate with an additional chemical selected from the group consisting of helium, argon, carbon dioxide, nitrogen, ammonia, hydrogen, oxygen and mixtures thereof.

3. The process of claim 1 wherein the film is a diffusion barrier.

4. The process of claim 1 wherein the precursor is selected from the group consisting of diethoxymethylsilane; dimethylethoxysilane; dimethyldiethoxysilane; diethyldiethoxysilane; dimethyldimethoxysilane; methyldiethoxysilane; methylethoxysilane; methylmethoxysilane; ethylethoxysilane; ethylmethoxysilane; methyltriethoxysilane; ethyltriethoxysilane; methyltrimethoxysilane; methyltrimethoxysilane; ethyltrimethoxysilane, vinylmethyldiethoxysilane, vinylmethylethoxysilane, vinylmethyldimethoxysilane, vinylmethylmethoxysilane and mixtures thereof.

5. The process of claim 1 wherein the temperature of the substrate is 100° C. to 500° C.

6. The process of claim 1 wherein the temperature of the substrate is 150° C. to 400° C.

7. The process of claim 1 wherein the temperature of the substrate is 250° C. to 350° C.

8. The process of claim 1 wherein the chemical vapor deposition reaction is a plasma enhanced chemical vapor deposition selected from the group consisting of plasma, pulsed plasma, helicon plasma, high density plasma, inductively coupled plasma, and remote plasma.

9. The process of claim 1 wherein after forming the film the substrate is subjected to UV radiation.

10. The process of claim 1 wherein the formed film has a density greater than 1.8 g/cc.

11. The process of claim 1 wherein the formed film has a refractive index greater than 1.5.

12. The process of claim 1 wherein the residence time is 20-65 msec.

13. The process of claim 1 wherein the dielectric constant is in the range of 3.2 to 6.0.

14. The process of claim 1 wherein the dielectric constant is in the range of 3.2 to 4.2.

15. The process of claim 1 wherein the film has a density to dielectric constant ratio greater than 0.3.

16. The process of claim 1 wherein the film has a density to dielectric constant ratio greater than 0.5.

17. A process for forming a barrier dielectric film between a dielectric film and a copper feature of an integrated circuit, comprising the steps of;
providing an integrated circuit substrate having a dielectric film prior to the formation of a copper feature;
contacting the substrate with a barrier dielectric film precursor selected from the group consisting of diethoxymethylsilane, dimethyldiethoxysilane and mixtures thereof, and a chemical selected from the group consisting of hydrogen, ammonia and mixtures thereof;
forming a barrier dielectric film on the substrate using plasma enhanced chemical vapor deposition reaction, wherein a residence time of a flow of the precursor and the chemical in the reaction is less than or equal to 85 msec;
forming a copper feature on the barrier dielectric film;
wherein the resulting barrier dielectric film has a density greater than 1.5 g/cc.

18. The process of claim 17 wherein a copper feature is deposited on the barrier dielectric film after the barrier dielectric film is deposited.

19. The process of claim 17 wherein the barrier dielectric film is subsequently exposed to UV radiation.

20. The process of claim 17 wherein the barrier dielectric film is a siliconoxycarbide.

21. The process of claim 17 wherein the barrier dielectric film has a dielectric constant less than 6.

22. The process of claim 21 wherein the barrier dielectric film has a dielectric constant greater than 3.2.

23. The process of claim 21 wherein the barrier dielectric film has a dielectric constant less than 4.2.

24. The process of claim 17 wherein the barrier dielectric film has a dielectric constant in the range of 3.2 to 4.2.

25. A process for forming a barrier dielectric film between a dielectric film and a copper feature of an integrated circuit, comprising the steps of;
providing an integrated circuit substrate having a dielectric film having a copper feature;
depositing an interface layer on the dielectric film having a copper feature capable of protecting the copper feature from oxidation;
contacting the substrate with a barrier dielectric film precursor selected from the group consisting of diethoxymethylsilane, dimethyldiethoxysilane and mixtures thereof, and a chemical selected from the group consisting of hydrogen, ammonia and mixtures thereof;
forming a barrier dielectric film on the substrate using a plasma enhanced chemical vapor deposition reaction of the barrier dielectric precursor precursor where a residence time of a flow of the precursor in the reaction is less than or equal to 85 msec;
wherein the resulting barrier dielectric film has a density greater than 1.5 g/cc.

26. The process of claim 25 wherein in the interface layer is CoWP.

27. The process of claim 25 wherein the barrier dielectric film has a refractive index greater than 1.5.

28. The process of claim 25 wherein the residence time is 20-65 msec.

29. The process of claim 25 wherein the barrier dielectric film has a dielectric constant is in the range of 3.2 to 6.0.

30. The process of claim 29 wherein the dielectric constant is in the range of 3.2 to 4.2.

31. A process for forming a film on a substrate comprising:
forming the film on the substrate via a chemical vapor deposition process using a linear alkylalkoxysilane precursor of the formula:

$$R_x R'_y (OR'')_z (OR''')_a Si$$

wherein R, R" and R'" are each individually selected from the group consisting of methyl, ethyl or vinyl; R' is selected from the group consisting of hydrogen, methyl, ethyl or vinyl; and x, z and a are each individually 1-3 and y is 0-2, wherein x+y+z+a=4 wherein a residence time of a flow of the precursor in the reaction is less than or equal to 85 msec.

32. The process of claim 31 wherein the chemical vapor deposition process further comprises an additional chemical selected from the group consisting of helium, argon, carbon dioxide, nitrogen, ammonia, hydrogen, oxygen and mixtures thereof.

* * * * *